United States Patent [19]
Martin

[11] 3,764,856
[45] Oct. 9, 1973

[54] HEAT TRANSFER IN ELECTRONIC EQUIPMENT

[75] Inventor: Jacob H. Martin, Wellesley, Mass.

[73] Assignee: Massachusetts Institute of Technology, Cambridge, Mass.

[22] Filed: May 17, 1972

[21] Appl. No.: 254,114

[52] U.S. Cl. ..... 317/100, 317/101 CM, 174/DIG. 5
[51] Int. Cl. .......... H05k 7/20
[58] Field of Search .......... 174/DIG. 3, DIG. 5; 317/100, 101 D, 101 CE, 101 CM

[56] References Cited

UNITED STATES PATENTS

| | | | |
|---|---|---|---|
| 3,061,760 | 10/1962 | Ezzo | 317/100 |
| 3,676,745 | 7/1972 | Traweek | 317/100 |
| 3,626,259 | 12/1971 | Torrance | 174/DIG. 5 |
| 3,025,437 | 3/1962 | Van Namen | 174/DIG. 5 |
| 3,496,634 | 2/1970 | Kurtz | 317/100 |
| 3,325,766 | 6/1967 | Kolb | 174/DIG. 3 |
| 3,111,641 | 11/1963 | Wilentchik | 317/101 D |

FOREIGN PATENTS OR APPLICATIONS

| | | | |
|---|---|---|---|
| 1,389,182 | 1/1965 | France | 174/DIG. 5 |

OTHER PUBLICATIONS

IBM Technical Disclosure Bulletin, Heat Dissipator Assemblies, Mandel, Vol. 8 No. 10 March 1966, pp 1460.

IBM Tech. Discl. Bull. Integrated Circuit Package and Heat Sink, Tiffany, Vol. 13 No. 1 June 1970, pp 58.

*Primary Examiner*—J. V. Truhe
*Assistant Examiner*—Gerald P. Tolin
*Attorney*—Arthur A. Smith, Jr. et al.

[57] ABSTRACT

Heat is conducted from electronic packages or modules by extending the leads of the packages or modules through a mother board, to which the leads are electrically connected, into thermal contact with a thermal sink, and particularly, into an electrically insulating and thermally conducting member (such as a beryllia or alumina block) in thermal contact with the thermal sink.

7 Claims, 8 Drawing Figures

HEAT TRANSFER IN ELECTRONIC EQUIPMENT

FIELD OF INVENTION

This invention relates to electronic packages or modules, and in particular to interconnection and heat transfer from high power density electronics such as large-scale integrated circuitry (LSI).

BACKGROUND OF INVENTION

Miniaturization of electronic equipment involves not only miniaturization of the circuit components but also the design and assembly of miniaturized components into a total integrated miniaturized system. The capacity of an LSI circuit, which is defined as a silicon chip containing the equivalent of 100 or more gates (or the equivalent of 600 or 700 components), to confine a great number of circuit components in a very small space does not necessarily lead to miniaturized electronic equipment. An approach which fails to consider the interrelation between the circuitry and the interconnections, heat transfer, and mechanical qualities required of the total equipment will not maximize miniaturization. Although the superposition of solutions technique of independently selecting appropriate connection schemes, adding a structural framework to hold these connectors together, and then adding heat transfer structure where required may appear as easy approach to package design, the resultant equipment is not at all the least weight, smallest volume, or lowest cost that could be achieved.

Among the requirements of high density electronics are efficient heat transfer systems. The power dissipation levels of closely interconnected silicon chips may be of the order of 10 watts per cubic inch or even higher, requiring far more powerful cooling techniques than conventional forced air or radiation cooling. If high powered components of modules are interconnected using multi-layered epoxy-glass wire boards, then it may be necessary to extend a thermal conductor through a hole in the board to a heat sink in order to conduct heat away from the components or modules. Such a technique requires increased component or module spacing on the circuit board to make up for the interconnection area lost to heat sink holes, and hence increases the volume required.

SUMMARY OF INVENTION

It is an object of this invention to provide lightweight, compact, high-power density, reliable and economical electronic modules and packages.

Another object is to improve heat transfer from electronic circuitry and components to heat sinks with a minimum use of material, or addition of external components, in order to maintain small size and light weight.

Applicant has discovered that electrical leads from electronic circuitry and components can be extended through a circuit board to which they are electrically connected into a thermal sink for a thermally conducting and electrically insulating member in thermal contact with the sink) to transfer heat from the circuitry to the thermal sink. In particular, the invention features an electronic assembly comprising heat-dissipating electronics having a plurality of leads, a thermal sink, a circuit board for electrical connection to the leads, and a plurality of thermoconductive elements which extend through the circuit board as extensions of the leads to the heat sink, one of the elements being connected to each lead.

In one preferred embodiment, the thermoconductive elements are integral extensions of the leads, and the thermally conducting and electrically insulating member is a beryllia or alumina block in thermal contact with the thermal sink. In another embodiment, the leads are removably secured in receptacles of an intermediate connector structure, and the thermoconductive elements are extendsions of said receptacles. In still another embodiment, a flat pack has leads secured to (and electrically and thermally connected to) thermoconductive elements extending generally at right angles to those leads through the circuit board to the thermal sink.

DESCRIPTION OF PREFERRED EMBODIMENT

Figure 1:
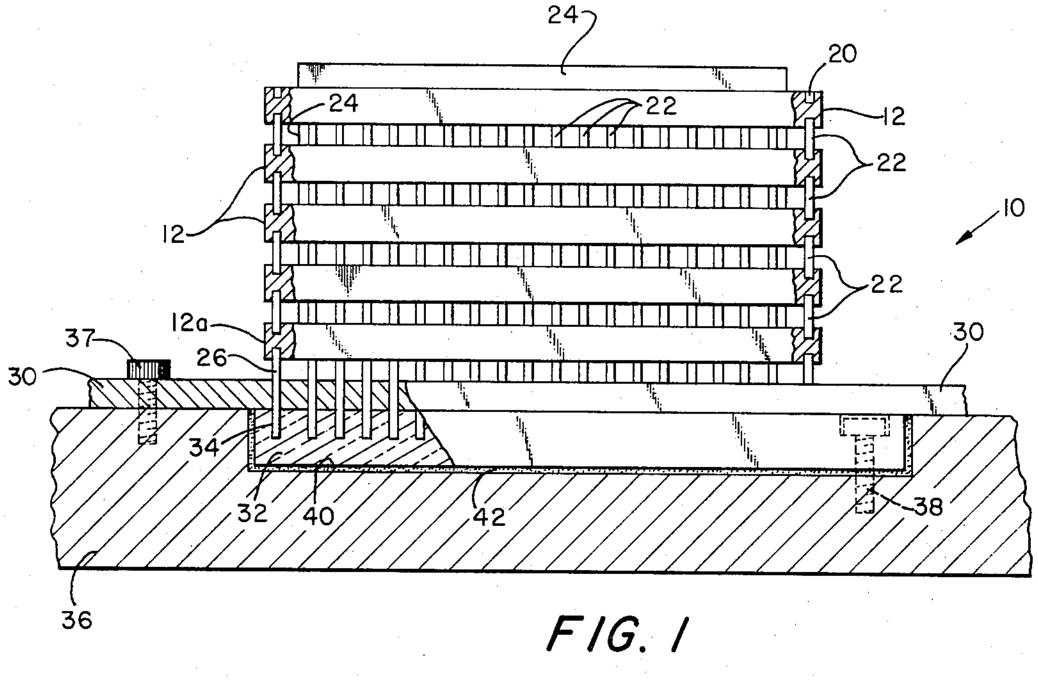
FIG. 1 is an axonometric view, partially broken away, of a diagrammatic representation of an electronic module having a heat transfer system in accordance with the present invention.
Figure 2:
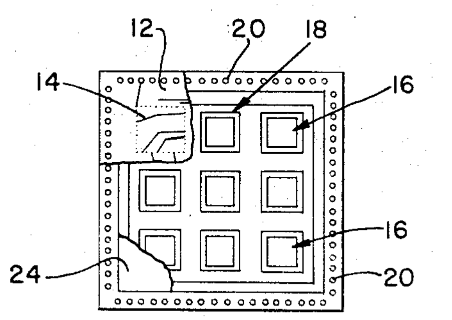
FIG. 2 is a plan view, partially broken away, of one of the multi-chip circuit boards assembled into the module of FIG. 1.
Figure 3:
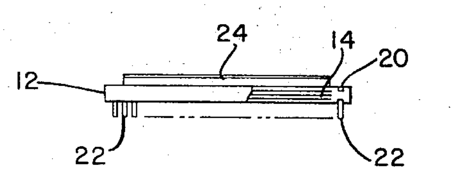
FIG. 3 is an end view, partially broken away, of the board of FIG. 2.

FIGS. 1–3 show a high density electronic module 10 consisting of heat-dissipating semiconductor circuits in the form of five ceramic multi-layer module wiring boards 12, each of which contains layers of wiring 14 separated by layers of alumina, and supports silicon chips 16. Ceramic (alumina) boards are preferred over epoxy-glass boards because of their heat conductivity, their hermeticity and the ability to make conductor paths and holes therein in smaller geometries. Each board 12 can typically have 2 to 10 layers of circuitry, with 1 to 10 mil thick alumina layers between wiring planes. The wiring is conventionally of tungsten, platinum, molymanganese or the like. Each one-inch square module wiring board 12 accommodates nine 140-mil square LSI (silicon) chips 16, each of which is contained in an appropriate chip cavity 18 in board 12. Spaced around the upper and lower periphery of each module wiring board 12 are 72 metallized pin cavities 20, sized to receive 72 input/output (I/0) pins 22. Pins 22 are brazed into the lower pin cavities. The surfaces of the pin cavities are electrically connected to the wiring 14. To interconnect the boards, each upper cavity 20 is filled with solder, and the pins 22 of the adjacent board are soldered into these cavities, using oven soldering, infrared, or other soldering techniques. A hermetic cover 24 seals the chips. Thus, the LSI chips 16 and the internal wiring 14 of each wiring board 12 are designed so that all of the required interconnections to and from the boards are made by the pins 22, and upper pin cavites 20.

72 elongated parallel pin extensions or risers 26 are soldered into the lowermost wiring board 12*a*. These risers, perpendicular to the board 12*a*, extend through and are electrically connected to multi-layer mother wiring board 30. From board 30, the risers extend into a thermally conducting and electrically insulating block 32. This block is preferably formed of beryllia or alumina, but for convenience will be hereinafter referred to as beryllia block 32. Block 32 contains metallized holes 34 into which the respective risers are soldered. In lieu of solder, thermoconductive cement or thermoconductive grease may be utilized to produce a low thermal resistance between risers 26 and block 32. In lieu of block 32, each lead could terminate in a sleeve of similar material which is glued directly into a cavity in thermal sink 36. Both pins 22 and reisers 26 are formed of a suitably electroconductive and thermoconductive material, such as copper, silver, nickel, and the like. Fastener 37 secures mother board 30 to thermal sink 36, and fastener 38 secures beryllia block 32 in an appropriately sized cavity 40 in thermal sink 36. A layer of thermal grease 42 is interposed in cavity 40 between block 32 and thermal sink 36.

Heat transfer is through the consecutively arranged pins 22 and the portions of the boards 12 between them and thence through risers 26 into beryllia block 32, and from there into thermal sink 36. The pins 22 (and their extensions, risers 26) hence serve three design functions—they electrically interconnect the wiring boards to one another into a module and the module to the mother board; they mechanically fasten the wiring boards to one another and support the total module; and, they transfer heat from the circuitry of the module to the heat sink. However, since the pins 26 take up no more space in mother board 30 than they would if used only for electrical connection to the board, the amount of mother board required per module is kept small, thus decreasing the space requirements between adjacent modules. The absence of any extraneous heat transfer structures (other than the negligible extensions of risers 26 into the beryllia block) contributes to minimizing both the weight and volume of the module and its interconnecting structures.

Figures 4, 5:
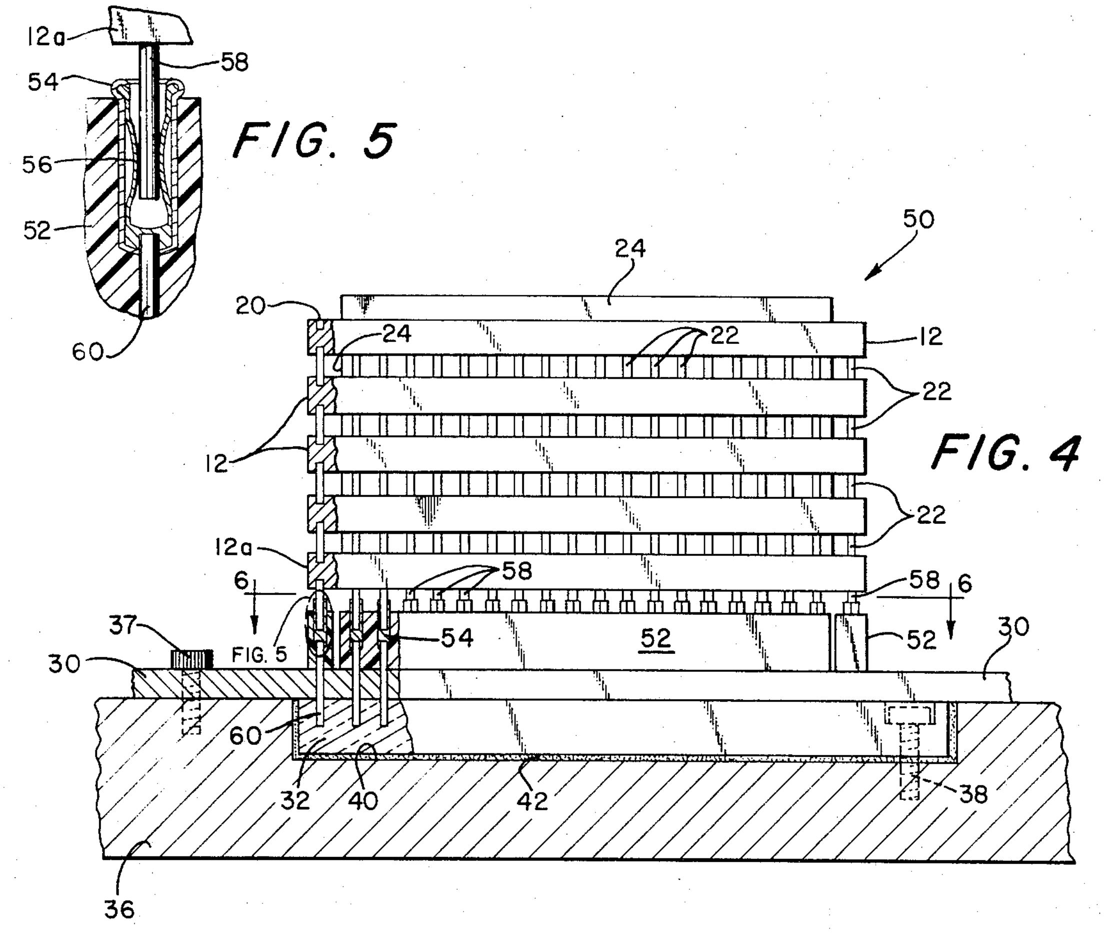
FIG. 4 is an axonometric view, partially broken away, of a diagrammatic representation of another electronic module having a heat transfer system in accordance with the present invention.
FIG. 5 is a magnification of a portion of the female connector block of the module of FIG. 4.
Figure 6:
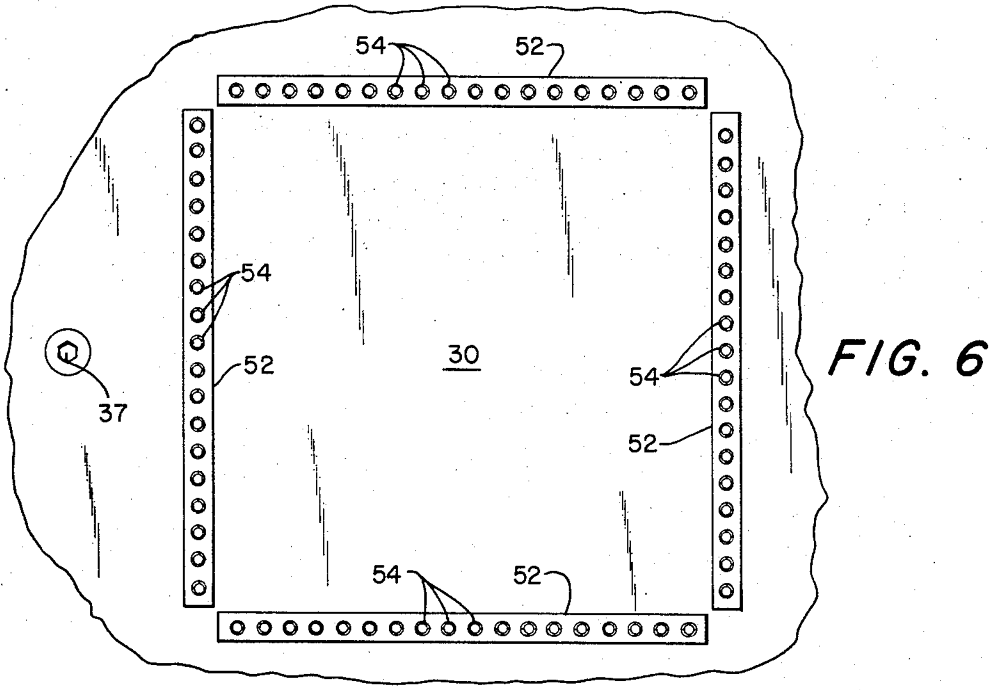
FIG. 6 is a sectional view of the module of FIG. 4, along the line 6—6 of FIG. 4.

FIGS. 4–6 show a detachable module 50, which consists of a plurality of wiring boards 12, formed and interconnected as described with reference to FIGS. 2 and 3, like parts having identical numbers. However, rather than having the lowermost pins of board 12*a* extend directly and permanently through mother board 30, four female connector blocks 52 are provided, each of which contains 18 copper connector cups 54. Each cup has a spring member 56 within, which receives the lowermost pins or leads 58 of wiring board 12*a* into electrical and thermal contact. A thermal conducting pin or riser 60 is secured (soldered, brazed, etc.) to the closed lower end of each cup 54, and extends through mother board 30, to which it is electricallyy connected, into beryllia block 32. The risers 60 are secured in block 32 by solder, thermoconductive cement, or thermoconductive grease, as described with reference to the risers 26 of FIG. 1. Since the lowermost pins 58 of block 12*a* are now only spring-mounted in a female connector block 52, the blocks 12 may be removed for repair, reconstruction, replacement or the like. The female connectors remain in place, with risers 60 permanently secured in block 32. Again, heat transfer is through the electrical leads of the system—to wit, from each wiring board 12 through its pins 22 and the cavities 20 and pin 22 of the next lower board, through lowermost pins 58, connector cups 54, and risers 60 into beryllia block 32.

Figure 8:
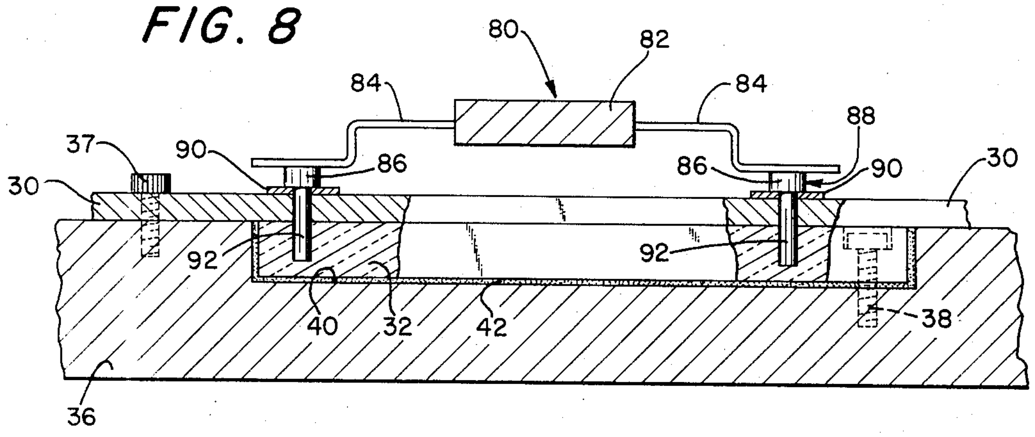
Figure 7:
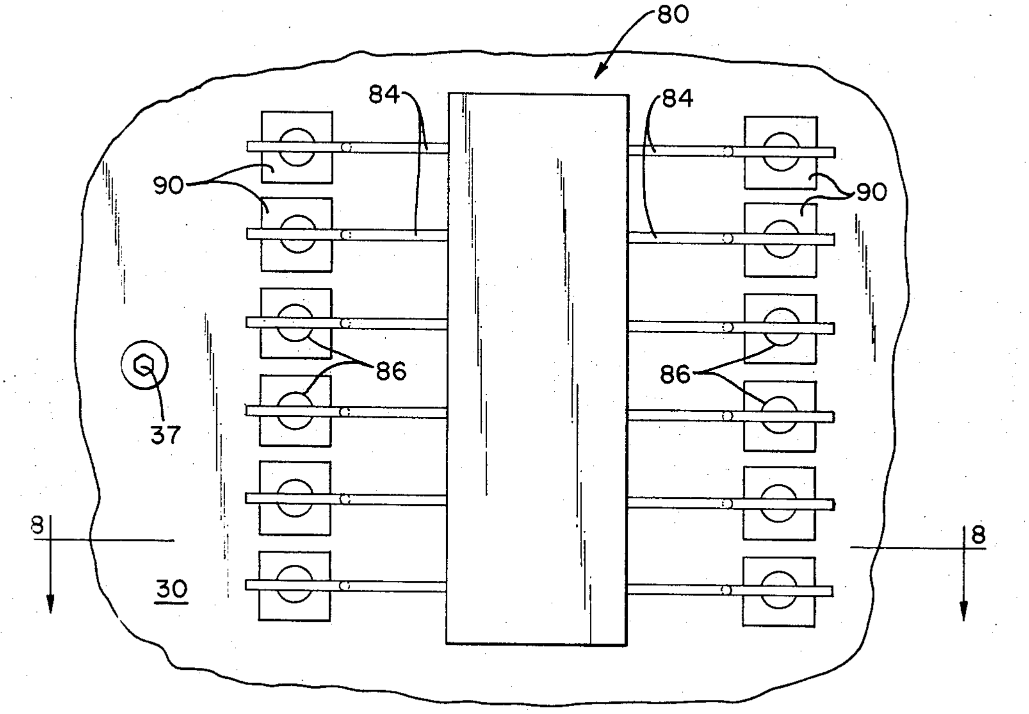
FIG. 7 is a plan view of an electronic package having a heat transfer system in accordance with the present invention; and, FIG. 8 is a sectional view of the package of FIG. 7, along the line 8—8 of FIG. 7.

FIGS. 7 and 8 show a "flat pack" 80, having an integrated circuitry block 82 and two sets of parallel leads 84. Each lead is soldered to the head 86 of a copper connector stud 88, the stud extending generally at right angles to the lead, and the lower surface of each stud head 86 is in turn in electrical and thermal contact with (and may be soldered to) a conventional connector pad 90 which is electrically connected to wiring in mother board 30. Each stud 86 has a stem 92 extending through mother board 30 into beryllia block 32, where it is secured by techniques described previously for thermally connecting risers 26 (FIG. 1) and risers 60 (FIGS. 4, 6) to block 32. Heat transfer from circuitry block 82 is through leads 84 and studs 88 into beryllia block 32.

Other embodiments will occur to one skilled on the art and are within the following claims.

What is claimed is:

1. An electronic assembly comprising:
- a plurality of heat-dissipating electrical components,
- a plurality of electrically conductive leads,
- an electrically insulating and thermally conducting circuit board having a plurality of connector pins attached to the board around its periphery,
- said electrical components and their leads being connected to each other and to said connector pins by said leads,
- said components, leads, and connector pins being in good thermal contact with said thermally conducting circuit board,
- a thermally conductive and electrically insulative block,
- a heat sink in good thermal contact with said block,
- said connector pins of said circuit board in good thermal contact with said block and having good thermal conductivity,
- whereby the heat generated is carried from said components through the circuit board and its connecting pins to a heat sink while allowing said connecting pins to be at different electrical potentials and insulated from one another.

2. The assembly of claim 1 comprising in addition:
- a wiring board substantially in parallel relation to said circuit board,
- said wiring board being located between said thermally conductive block and said circuit board,
- said wiring board having a plurality of connector pins corresponding to the pins of the circuit board,
- said circuit board connector pins being thermally connected to said thermally conductive block by the corresponding connector pins of the wiring board,
- said connector pins being substantially transverse to the planes of the boards.

3. The assembly of claim 2 wherein said wiring board connector pins terminate within said thermally conductive block without penetrating the thickness of said block.

4. The assembly of claim 3 wherein said thermally conductive block has pins in good thermal contact therewith, said pins corresponding to the pins of said circuit board, said block pins being thermally connected to the circuit board pins through said wiring board pins.

5. The assembly of claim 2 comprising in addition:

a plurality of said circuit boards with their connector pins, said boards being stacked and having their corresponding connector pins in good electrical and good thermal contact with each other.

6. The assembly of claim 5 wherein said wiring board has female connector blocks mounted thereon, said connector blocks containing connector cups corresponding to the connector pins adapted to removably secure the connector pins of the circuit board nearest it in good electrical and good thermal contact, said connector cups being in good thermal contact with corresponding pins mounted in said thermally conductive block.

7. The assembly of claim 3 wherein said heat sink is an electrically conductive metal, said metal being in mechanical contact with said electrically insulating thermally conducting block on the face of said block opposite that which is penetrated by the conducting pins.

* * * * *

UNITED STATES PATENT OFFICE
CERTIFICATE OF CORRECTION

Patent No. 3,764,856 Dated October 9, 1973

Inventor(s) Jacob H. Martin

It is certified that error appears in the above-identified patent and that said Letters Patent are hereby corrected as shown below:

Insert the following after the title:

-- The invention described herein was made in performance of work under a NASA Contract and is subject to the provisions of Section 305 of the National Aeronautics and Space Act of 1958, Public Law 85-568 ( 72 Stat. 435; 45 USC 2457). --.

Signed and sealed this 1st day of October 1974.

(SEAL)
Attest:

McCOY M. GIBSON JR.
Attesting Officer

C. MARSHALL DANN
Commissioner of Patents